US005834689A

United States Patent [19]

Cook

[11] Patent Number: 5,834,689

[45] Date of Patent: Nov. 10, 1998

[54] CUBIC BORON NITRIDE COMPOSITE STRUCTURE

[75] Inventor: Arnold J. Cook, Mt. Pleasant, Pa.

[73] Assignee: PCC Composites, Inc., Longmont, Colo.

[21] Appl. No.: 162,430

[22] Filed: Dec. 2, 1993

[51] Int. Cl.[6] .............................. H02G 3/08; H05K 5/02

[52] U.S. Cl. .............................. 174/50

[58] Field of Search .............................. 174/50; 428/328

[56] References Cited

U.S. PATENT DOCUMENTS

| | | | |
|---|---|---|---|
| 3,913,279 | 10/1975 | Broïdo | 451/548 |
| 4,063,909 | 12/1977 | Mitchell | 51/309 |
| 4,703,898 | 11/1987 | Nakagawa et al. | 241/30 |
| 4,871,008 | 10/1989 | Dwivedi et al. | 164/6 |
| 4,923,490 | 5/1990 | Johnson et al. | 51/298 |
| 4,937,416 | 6/1990 | Kubota et al. | 219/69.17 |
| 5,212,625 | 5/1993 | van Andel et al. | 361/383 |
| 5,330,701 | 7/1994 | Shaw et al. | 419/10 |
| 5,486,281 | 1/1996 | Gruver et al. | 205/110 |

*Primary Examiner*—Kristine L. Kincaid
*Assistant Examiner*—Dean A. Reichard
*Attorney, Agent, or Firm*—Klarquist Sparkman Campbell Leigh & Whinston, LLP

[57] ABSTRACT

The present invention pertains to a composite structure comprised of a matrix material, such as metal, and a plurality of cubic boron nitride particles dispersed within and surrounded by the matrix material. In a first embodiment, the composite structure is used as an electronic package to house an electrical device such as an integrated chip. The cubic boron nitride particles are dispersed within the matrix material in proportion such that the coefficient of thermal expansion of the package essentially matches that of the electronic devices. In another embodiment, the composite structure can be used as a thermal conductor, such as a heat sink. Since cubic boron nitride particles have the highest thermal conductivity of any ceramic, they act in combination with the matrix metal to transfer heat efficiently. In another embodiment, the composite structure can be used as a component subject to attrition. The cubic boron nitrides offer unexcelled wear resistance and transfer the heat efficiently.

30 Claims, 1 Drawing Sheet

18
12
10
15 14

CUBIC BORON NITRIDE COMPOSITE STRUCTURE

FIELD OF THE INVENTION

The present invention is related to composite materials. More specifically, the present invention is related to a composite material having cubic boron nitride.

BACKGROUND OF THE INVENTION

It is known to add reinforcement particles to a material to increase the strength and wear resistance of a material. Reinforcement particles are typically made of ceramic particles or graphite particles. Though these particles such as SiC do offer increased strength and wear resistance, they suffer in that they provide only limited heat transfer increases and limited control of thermal expansion.

Accordingly, the present invention describes a composite material and components such as electronic packages which use cubic boron nitride to provide high wear resistance and the highest heat transfer and CTE in a composite system. Also, proposed is the method of net shape production with a pure metal skin with pressure infiltration casting. Diamond has a thermal conductivity as high as 2,000 WM/°C. followed by cubic boron nitride with a conductivity as high as 1,700 WM/°C. However, cubic boron nitride often creates a higher thermal conductivity composite material and component.

SUMMARY OF THE INVENTION

The present invention pertains to a composite structure comprised of a matrix material, such as metal, and a plurality of cubic boron nitride particles dispersed within and surrounded by the matrix material.

In a first embodiment, the composite structure is used as an electronic package to house an electrical device such as an integrated chip. The cubic boron nitride particles are dispersed within the matrix material in proportion such that the coefficient of thermal expansion of the package essentially matches that of the electronic devices. Cubic boron nitride is more stable than diamond at high temperature. At temperatures near 800° to 900° C. diamond starts to change from a high thermally conductive form of carbon to a very low form. Diamond is also more reactive with some liquid metals such as aluminum. Composite components made by liquid metal processes such as pressure casting require high temperatures of the particles to be infiltrated. Cubic boron nitride reinforced composites are higher in thermal conductivity than diamond reinforced composites due to the interface between the metal and particles even though diamond has a higher thermal conductivity.

In another embodiment, the composite structure can be used as a thermal conductor, such as a heat sink. Since cubic boron nitride particles have high thermal conductivity, they act in combination with the matrix metal to transfer heat efficiently.

In another embodiment, the composite structure can be used as a component subject to attrition. The cubic boron nitride particles offer unexcelled wear resistance and transfer the heat efficiently.

The invention is also a method of producing a cubic boron nitride composite structure comprising the steps of casting cubic boron nitride particles, binding particle and flow medium into a mold. Then, there is the step of heating the mixture such that flow medium is essentially removed and the binding particles hold the cubic boron nitride particles into a preform. Next, there is the step of infiltrating the preform with molten matrix material. Then, there is the step of cooling the matrix material. Alternatively, loose cubic boron nitride particles may be infiltrated directly with the matrix material.

In an alternative embodiment, the method for producing a composite structure includes the step of casting a mixture of cubic boron nitride particles and matrix material in a mold. Then, there is the step of cooling the mixture such that the matrix material solidifies. Preferably, the cooling step includes the step of directionally solidifying the matrix material.

In an alternative embodiment, the method for producing a composite structure includes the steps of mixing cubic boron nitride particles and metal particles and then pressing or forming them into a shape and then sintering until solid.

BRIEF DESCRIPTION OF THE DRAWINGS

In the accompanying drawings, the preferred embodiment of the invention and preferred methods of practicing the invention are illustrated in which.

DESCRIPTION OF THE PREFERRED EMBODIMENT

Figure 1:
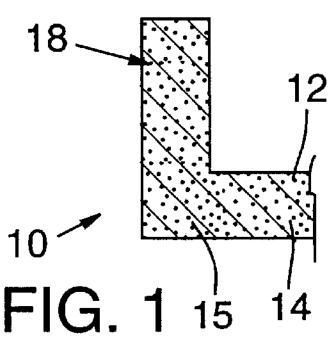
FIG. 1 is a schematic representation showing a cross section of the composite structure.

Referring now to the drawings wherein like reference numerals refer to similar or identical parts throughout the several views, and more specifically to FIG. 1 thereof, there is shown a composite structure 10. The structure 10 is comprised of a matrix material 12, such as metal, and a plurality of cubic boron nitride particles 14 dispersed within and surrounded by the matrix material 12. Preferably, the composite structure 10 also has reinforcing fibers 15 dispersed within the matrix material 12, which can reduce the amount of cubic boron nitride required. A skin 18 of pure matrix material can surround the composite structure. In this embodiment, all cubic boron nitride particles 14 are disposed completely below the surface of the composite structure 10. Alternatively, some of the cubic boron nitride particles 14 can be disposed on the outer surface of the composite structure 10. The matrix material is preferably metal such as aluminum, copper, magnesium, nickel or silver, but is not limited to these.

Figure 2:
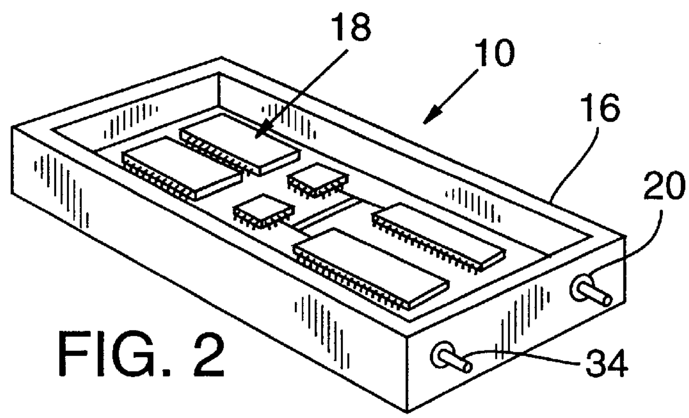
FIG. 2 is a schematic representation showing a cubic boron nitride composite electronic package.

As shown in FIG. 2, the composite structure 10 can be a package 16 for housing an electrical device 18, such as a computer chip. The cubic boron nitride particles 14 are dispersed within the matrix material 12 in proportion such that the coefficient of thermal expansion of the package 16 essentially matches that of the electronic device 18. The cubic boron nitride composite packages 16 can be manufactured to match the coefficient of thermal expansion of silicon, alumina or gallium arsenide circuit substrates. In this manner, during thermal cycling, the package 16 and the electronic device 18 will expand and contract in unison thereby preventing separation of the electronic device 18 from the package 16 which would result in an electronic disconnection. This is very important in applications where a wide range of temperatures exist such as in satellites and high speed aircraft. The package 16 preferably has unreinforced areas 20 of pure matrix material 12 for drilling operations or for welding or brazing procedures. Further, the cubic boron nitride particles 14 transfer heat extremely well. The thermal conductivity of this system can be higher than any other composite system. 1100 aluminum and 70% cubic boron nitride particles produce a conductivity 50–100% greater than that of SiC/Al.

Figure 3:
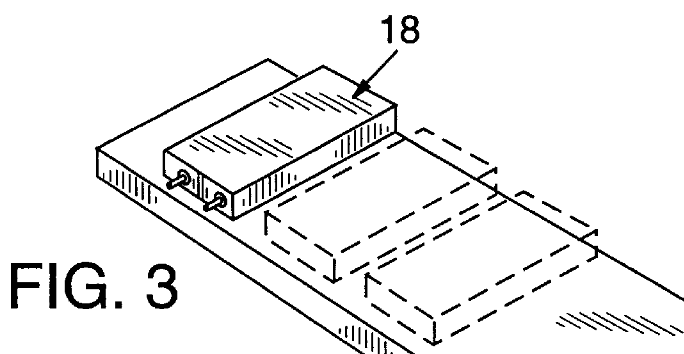
FIG. 3 is a schematic representation showing a cubic boron nitride composite thermal transfer element.

As shown in FIG. 3, the composite structure 10 can be used a thermal conductor, such as a heat sink 22 for an electronic device 18. Preferably, the heat sink 22 has heat transfer fins 24 and is comprised of a highly conductive matrix material such as aluminum. The cubic boron nitride particles have a thermal conductivity of 1700–1750 W/M°C. which is the highest thermal conductivity of any ceramic. Accordingly, a composite heat sink 22 having cubic boron nitride particulates would transfer heat more efficiently than a composite heat sink having graphite or silicon carbide particles. Preferably, the heat sink can draw heat away from a plurality of electronic devices 18 as shown by the dotted lines. Preferably, the heat sink 22 has cooling channels for transferring heat away. Alternatively, a heat pipe can be included to add heat to the composite structure 10.

Figure 4:
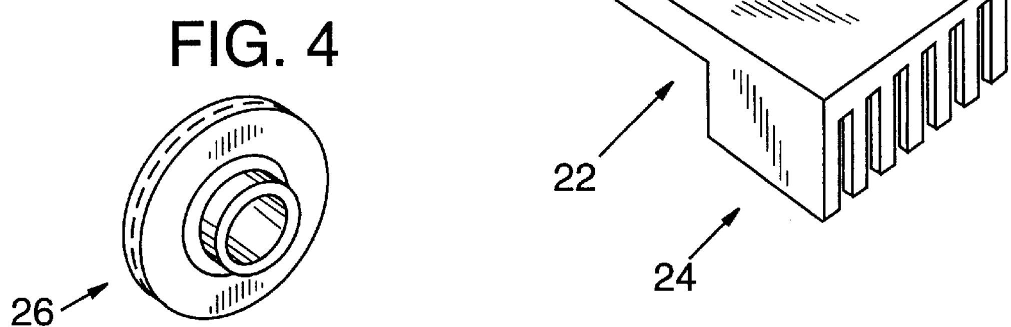
FIG. 4 is a schematic representation showing a cubic boron nitride composite brake rotor.
Figure 5:
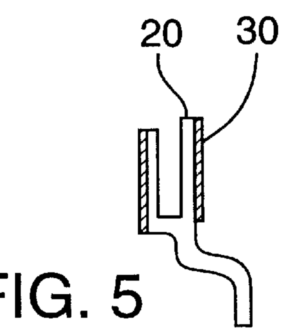
FIG. 5 is a schematic representation showing a cross section of the brake rotor.
Figure 6:
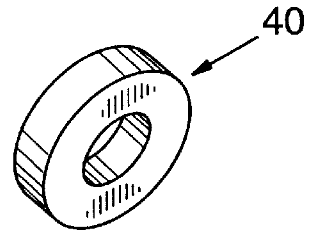
FIG. 6 is a schematic representation showing a cubic boron nitride composite bearing.

The composite structure can be a component which is subject to wear such as a brake rotor 26, as shown in FIG. 4, or a bearing 40, as shown in FIG. 6. The cubic boron nitride particles 14 offer unequaled wear resistance and transfer heat efficiently. For economy, cubic boron nitride particles 14 can be selectively used where wear resistance is most desired. Other types of particles such as silicon carbide fibers or graphite can also be used in combination with the cubic boron nitride. Preferably, as shown in FIG. 5, which is a cross section of the brake rotor shown in FIG. 4, the matrix material 12 has a reinforced portion 30 in which the cubic boron nitride particles 14 are disposed and an unreinforced portion 20 which is void of cubic boron nitride particles 14. In this manner, the cubic boron nitride particles 14 can be positioned only in wear areas. This selective positioning can be attained by forming the cubic boron nitride particles 14 into a preform which is then infiltrated with molten matrix material 12. The surface of the metal matrix can be etched away to expose the cubic boron nitride particles. Cubic boron nitride composite brake shoes are also envisioned as well as almost any structure which is subject to attrition.

The invention is also a method of producing a cubic boron nitride composite structure comprising the steps of casting cubic boron nitride particles and flow medium into a mold. Then, there is the step of heating the mixture such that flow medium is essentially removed. Next, there is the step of infiltrating the preform with molten matrix material. Then, there is the step of cooling the matrix material. Rapid cooling can keep reactions to a minimum between the cubic boron nitride and metal. Preferably, binding particles are disposed within the flow medium and during the heating step the binding particles are sintered together to hold the cubic boron nitride particles in a preform. Loose cubic boron nitride particles may also be infiltrated. Other processes may be used but they may require a coating on the cubic boron nitride to prevent reaction.

Preferably, the cooling step includes the step of directionally solidifying the matrix material and the cubic boron nitride particles. If it is desired, the preform can be evacuated prior to heating or infiltration.

In an alternative embodiment, the method for producing a composite structure includes the step of casting a mixture of cubic boron nitride particles and matrix material in a mold. Then, there is the step of cooling the mixture such that the matrix material solidifies. Preferably, the cooling step includes the step of directionally solidifying the matrix material.

An alternative method includes the steps of forming a preform of cubic boron nitride and then loading it into a mold, pulling a vacuum and then forcing liquid metal into the mold with gas or mechanical pressure.

In the operation of the preferred embodiment, an electronic radar module for an aircraft is produced by mixing 50% by volume 100 micron size cubic boron nitride particles 14 with 25% by volume 10 micron cubic boron nitride particles 14 with 2% by volume 1 micron silica particles and wax to form a preform mixture. The preform mixture is then cast into a mold and heated at a controlled rate to over 700° C. so that the wax is essentially removed and the silica particles become fused and bind the cubic boron nitride particles 14 together to form a preform. The preform is then positioned within a mold and infiltrated with molten aluminum. It is not necessary for the preform to fill the entire volume of the mold. Also, cubic boron nitride packing over 50% may not require silica particles. Open areas within the preform will be filled with pure aluminum to form unreinforced portions 20 on the package 16. By the use of pressure infiltration casting, a thin skin of metal can be formed around the part such that the part can be net shape and easily plated on the pure metal surface. This makes it possible for the user to drill out unreinforced areas left in the preform for feedthroughs, etc. and the user never needs to machine the cubic boron nitride composite material.

The cast package 16 is then directionally solidified and removed from the mold. The resulting coefficient of thermal expansion of the radar module matches that of the gallium arsenide circuits. Holes are drilled in the unreinforced portions 20. Wire feedthroughs 34 are inserted into the holes and hermetically sealed by brazing. Gallium arsenide circuits are brazed on the radar module. The entire radar module is then connected to the appropriate apparatuses within the aircraft.

During flight, the radar module is subjected to an extreme range of temperatures. The radar module reacts to this thermal cycling by expanding and contracting in proportion to its coefficient of thermal expansion. Since the gallium arsenide circuits have a matching coefficient of thermal expansion they contract and expand in unison with the radar module. In this manner, the circuits remain in constant contact with the radar module, thereby ensuring unbroken electrical connections. Further, since the cubic boron nitride particles 14 have the second highest thermal conductivity of any ceramic, they act with the aluminum to transport heat away from the circuits in an efficient manner. These circuits are also very low density compared with the copper materials often used.

In another embodiment, particles of cubic boron nitride are mixed with aluminum particles. The particles are then mixed with a polymer and injection molded. The system is then sintered in a high vacuum furnace to consolidate the part.

In another embodiment, the cubic boron nitride particles are coated with metal and then consolidated.

In another embodiment, the cubic boron nitride particles are mixed with metal particles and then hot isostatic pressed to consolidate the part.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. A net shape composite article comprising:

a metal matrix material; and a plurality of cubic boron nitride particles dispersed within and surrounded by the metal matrix material.

2. A composite article as described in claim 1 wherein the composite article has an outer skin consisting essentially of a metal which forms a continuum with the metal matrix and which is of the same composition as the metal matrix.

3. A composite article as described in claim 1, including particles of material besides the cubic boron nitride particles.

4. A composite article as described in claim 3 including reinforcement fibers dispersed within the metal matrix material.

5. A package for housing an electronic device comprising:

a metal matrix material; and a plurality of cubic boron nitride particles dispersed within the metal matrix material in proportion such that the coefficient of thermal expansion of the package essentially matches that of the electronic device.

6. A package as described in claim 5 wherein the package has an outer skin comprised of pure matrix material.

7. A package as described in claim 5 including particles of material besides the cubic boron nitride particles.

8. A package as described in claim 7 including reinforcement fibers dispersed within the matrix material.

9. A package as described in claim 8 which is net shaped.

10. A net shape thermally conductive body comprising:

a metal matrix material; and a plurality of cubic boron nitride particles dispersed within and surrounded by the metal matrix material.

11. A thermally conductive body as described in claim 10 wherein the matrix material forms heat transfer fins.

12. A thermally conductive body as described in claim 10 including particles of material besides the cubic boron nitride particles.

13. A thermally conductive body as described in claim 12 including reinforcement fibers disposed within the matrix material.

14. A thermally conductive body as described in claim 10 wherein the matrix material comprises aluminum.

15. A thermally conductive body as described in claim 10 wherein the matrix material comprises magnesium.

16. A thermally conductive body as described in claim 10 wherein the matrix material comprises copper.

17. A thermally conductive body as described in claim 10 wherein the matrix material comprises a non-ferrous metal.

18. A thermally conductive body as described in claim 10 wherein the matrix material comprises a ferrous metal.

19. A thermally conductive body as described in claim 15, further comprising an outer skin consisting essentially of a metal which forms a continuum with the metal matrix and which is of the same composition as the metal matrix.

20. A net shape component subject to wear comprising:

a metal matrix material; and a plurality of cubic boron nitride particles dispersed within and surrounded by the metal matrix material.

21. A component as described in claim 20 wherein the matrix material has a reinforced portion in which the cubic boron nitride particles are disposed and an unreinforced portion which is void of cubic boron nitride particles.

22. A component as described in claim 21 including particles of material besides the cubic boron nitride particles.

23. A component as described in claim 22 including reinforcement fibers dispersed within the matrix material.

24. A net shape composite structure comprising:

a metal matrix material;

a plurality of cubic boron nitride particles dispersed within and surrounded by the matrix material;

particles of material besides the cubic boron nitride particles dispersed within and surrounded by the matrix material; and an outer skin comprised of pure matrix material.

25. A thermal conductor comprising:

a metal matrix material;

a plurality of cubic boron nitride particles dispersed within and surrounded by the matrix material; and heat transfer fins formed by the metal matrix material.

26. A net shape thermal conductor comprising:

a metal matrix material;

a plurality of cubic boron nitride particles dispersed within and surrounded by the matrix material; and particles of material besides the cubic boron nitride particles dispersed within and surrounded by the matrix material.

27. A net shape component subject to wear comprising:

a metal matrix material;

a plurality of cubic boron nitride particles dispersed within and surrounded by the matrix material;

particles of material besides the cubic boron nitride particles dispersed within and surrounded by the metal matrix material; and an outer skin comprised of pure matrix material.

28. A composite article comprising:

a metal matrix material;

a plurality of cubic boron nitride particles dispersed within and surrounded by the metal matrix material; and reinforcement fibers dispersed within the metal matrix material.

29. A thermally conductive body comprising:

a metal matrix material;

a plurality of cubic boron nitride particles dispersed within and surrounded by the metal matrix material; and reinforcement fibers dispersed within the metal matrix material.

30. A component subject to wear comprising:

a metal matrix material;

a plurality of cubic boron nitride particles dispersed within and surrounded by the metal matrix material; and reinforcement fibers dispersed within the metal matrix material.

* * * * *